United States Patent

[11] 3,622,896

[72] Inventor George Pircher
Paris, France
[21] Appl. No. 35,077
[22] Filed May 6, 1970
[45] Patented Nov. 23, 1971
[73] Assignee Thomson-CSF
Paris, France
[32] Priority May 14, 1969
[33] France
[31] 15,711

[54] MICROWAVE SIGNAL-PROCESSING CIRCUITS, AND PARTICULARLY MICROWAVE FM DISCRIMINATOR
10 Claims, 2 Drawing Figs.

[52] U.S. Cl. .......... 329/116, 325/445, 325/448, 329/160, 332/29 M, 333/1.1, 333/24.1
[51] Int. Cl. .......... H03d 3/00
[50] Field of Search .......... 332/16, 29 M, 29, 51, 51 W; 329/110, 116, 160, 161; 325/445, 446, 448; 333/1.1, 24.1, 24 G

[56] References Cited
UNITED STATES PATENTS
2,769,960 11/1956 Mumford .......... 332/51 WU
2,866,949 12/1958 Tillotson .......... 333/1.1
2,928,940 3/1960 Ruthroff .......... 329/116
3,408,596 10/1968 Forward et al. .......... 332/51 X
3,562,651 2/1971 Hoover et al. .......... 325/448 X

*Primary Examiner*—Alfred L. Brody
*Attorney*—Flynn & Frishauf

ABSTRACT: A first hybrid circuit has a microwave signal applied thereto and has two signal component outputs, 90° out of phase with respect to each other. The hybrid circuit is interconnected to a second hybrid, in the form of a magic Tee, and delivers sum and difference signals of the inputs, which are then applied to a difference detector. The interconnection between the two hybrid circuits includes, in one line a ferromagnetic resonator located in a magnetic field set to the center frequency of the applied input signal to the first hybrid; upon deviation of the frequency of the input signal from the center, with the magnetic field constant, the second hybrid will develop sum and difference signals which can be detected, so that a frequency-varying signal is being analyzed. In an alternative, the input signal is kept at constant frequency and the magnetic field strength is varied, the change in the output signal than being indicative of variation of magnetic field strength.

Figure 1:
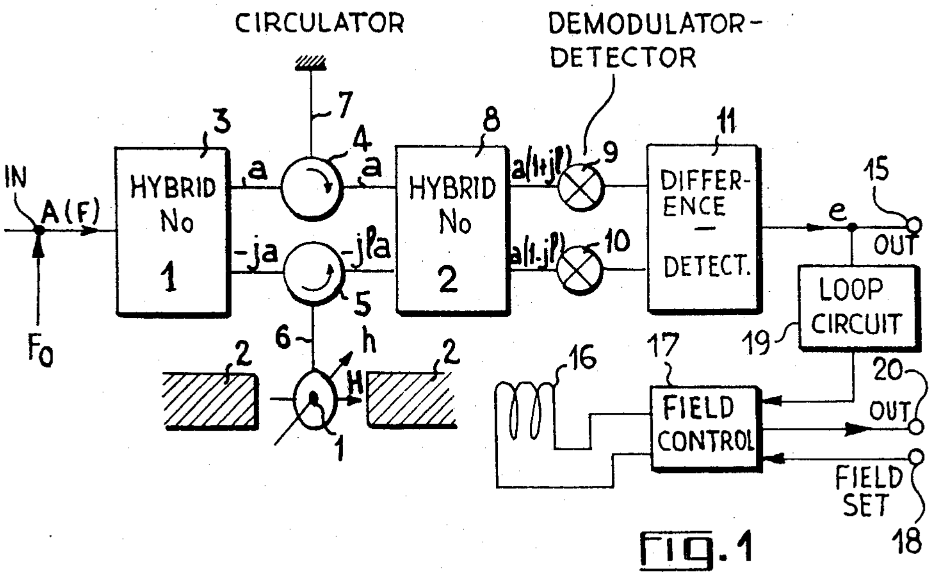

MICROWAVE SIGNAL-PROCESSING CIRCUITS, AND PARTICULARLY MICROWAVE FM DISCRIMINATOR

The present invention relates to microwave circuitry, and more particularly to microwave signal-processing circuits in which the characteristics of electrical microwave signals, varying about a center value, are analyzed, such as microwave FM detectors. The system of the present invention provides a particularly good wide band response, discriminating frequency excursions with high precision and low distortion.

Frequency modulation discriminators provide output signals of amplitude variations corresponding to frequency excursions of the signal to be analyzed, with respect to a central, or carrier frequency. The sign of the variation of the output signal may follow the sign of the excursion of the input signal, or may be independent of this excursion in dependence of the type of discriminator circuit used. The present invention is particularly applicable to the discriminator which has an output following both in sign and variation the excursion of an input signal. Such FM discriminators may be used in demodulation and detection systems, or in automatic frequency control systems; the signals which are delivered at the output will, thus, have characteristics representative of excursion of frequency of an input signal, to be analyzed, or to be corrected. The output signal may effect the correction by utilizing the output as an error signal, separately, or in a closed loop.

Frequency discriminators operating at microwave and superhigh-frequency ranges usually utilize resonant cavities operating at the frequency range surrounding the resonant frequency. Such discriminators are difficult to control since frequency variations depend on the cavity structure, and its geometry, and thus change of the central frequency, around which the discrimination is to be effected, cannot be obtained other than by changing, mechanically, the dimensions or the geometry of the cavity. This limits considerably the various uses to which such cavities can be put; variations in basic or carrier frequency for the cavities is always slow. Further, the bandwidth which can be handled by the cavities is relatively small.

It is an object of the present invention to provide a microwave signal-processing system, particularly adapted as a frequency modulation discriminator, which is entirely electrically controllable.

SUBJECT MATTER OF THE PRESENT INVENTION

Briefly, a ferromagnetic resonator is used in two branched signal channels which, at the center frequency, are in equilibrium. Since the ferromagnetic resonators can be controlled electrically, the center frequency of operation can easily be changed. In the system, a pair of hybrid circuits are used to split the input microwave signals into the two branches, to be applied to the two channels.

Change in the base frequency is not only rapid, because it can be done electrically, but, since the ferromagnetic resonators have a wide frequency band, a discriminator characteristic which is linear over a wide frequency range can be obtained, while, additionally, providing for wide operating bandwidths of the system.

If the input frequency is maintained at a given level, variation of the magnetic field applied to the ferromagnetic resonator can be detected by detecting the outputs from the branches of the hybrid junction.

Figure 2:
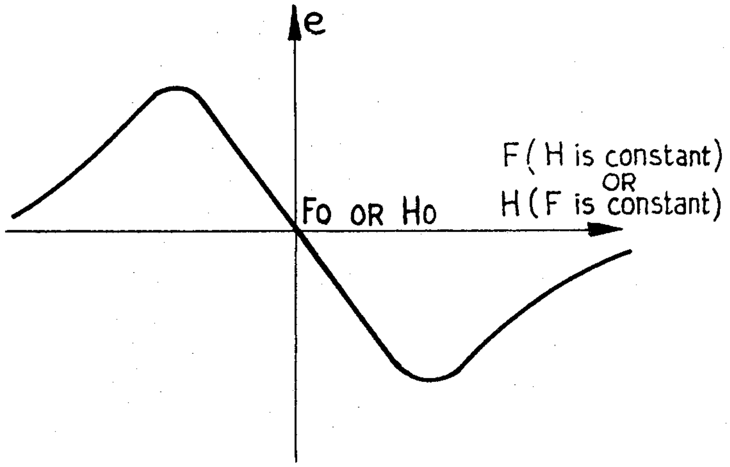

The invention will be described by way of example with reference to the accompanying drawings, wherein:

FIG. 1 is a simplified schematic circuit diagram of a system in accordance with the present invention, in which those parts which are well-known elements are shown in block form;

and FIG. 2 is a graph illustrating the discriminator transfer characteristics obtained by the system of FIG. 1.

A ferromagnetic resonator 1 is inserted in a circuit formed of two channels, or branches in equilibrium. Resonator 1 may be a small sphere of ferromagnetic material, such as yttrium-iron garnet, placed in a continuous magnetic field H. The magnetic field H is provided by magnets 2—2 which may be permanent magnets, or electromagnets supplied by a coil 16. Magnetic field H polarizes the garnet.

The microwave frequency circuit includes an input hybrid junction 1, illustrated as block 3. This hybrid junction 3 splits the input power of an input signal A (F) into two equal output branches, out of phase with each other by $\pi/2$, that is output signals $a$ and $-ja$. Circuit 3 may, for example, be a 3db. coupler of known type. Each one of the outputs of circuit 3 is connected to an input of a circulator 4, 5, having three terminals. The circulators are identical, and are schematically shown by circles, the arrows indicating the sense of wave propagation. One channel of circulator 5 directs wave $-ja$. towards the garnet. Line 6 transmits this wave, and is, for example, terminated in a loop which creates, within the garnet, a magnetic alternating field $h$ having a frequency F equal to that of the signal which generates the field, at any instant. The intensity of this field is small with respect to that of the continuous direct magnetic field H, and the direction of the two fields are selected to be at right angles with respect to each other. The wave reflected back towards the circulator 5 by the garnet, ferromagnetic resonator 1, and the associated loop is a function of the resonance of the garnet. Assume $\rho$ is the reflection coefficient of resonator 1, then the reflected signal will be $-j\rho a$. For a predetermined and known value of the field H, the reflection coefficient $\rho$ of the resonator 1 is a function of the frequency F of the alternating filed $h$. When the frequency F is equal to a frequency $F_o$, which is the resonant ferromagnetic frequency, then the reflection coefficient $\rho$ is a minimum and the reflecting wave is practically zero. If, however, the frequency F departs from the center value $F_o$, in one sense or the other, then the reflection coefficient $\rho$ increases. The reflected wave $-j\rho a$ is obtained at the output of the circulator 5 at its third terminal.

Circulator 4 in the other channel is connected to the second output of the coupler hybrid 3 in the same manner as circulator 5. A line 7, of the same length as line 6, connects circulator 4 to a termination reflecting practically the entirety of the wave applied thereto, of frequency F of the wave. The function of circulator 4 is merely to provide for phase equilibrium of the waves transmitted by the two branches of the circuit thus formed.

The signals $a$ and $-j\rho a$ are then applied, each separately, to a separate respective input of a second hybrid circuit 8 having a pair of outputs, at which respectively the sum and the difference of the inputs is obtained. This second hybrid circuit 8 may be a magic Tee supplying two output waves: $a(1+j\rho)$ and $a(1-j\rho)$. Each one of the outputs are applied to a microwave detector 9, 10 respectively. The two signals thus detected are then applied to a circuit 11 which is a difference detector, having at its output terminal a voltage $e$ proportional to the difference. The voltage $e$ is available at terminal 15.

FIG. 2 illustrates the discrimination curve obtained by the system of FIG. 1 for a constant filed H. The frequency of the input wave to be analyzed appears on the abscissa, the value of the output voltage $e$ available at terminal 15 from circuit 11 is indicated on the ordinate.

For a center frequency $F_o$, of the input wave, and for a predetermined value of magnetic field H, in accordance with classic laws of ferromagnetic resonance, garnet 1 will be in exact resonance and the waves detected in detectors 9, 10, will be equal in phase and amplitude and the difference detector 11 will have a zero output. This is indicated at the intersection of the axes in FIG. 2. Upon excursion of frequency F from the center value, the output voltage $e$ increases, or decreases in proportion to the excursion; the sign is a characteristic of the excursion. The sign relationship of the curve of FIG. 2 with respect to increase, or decrease of frequency, in FIG. 2 decreasing with increasing frequency, is immaterial, depending only on the internal connection of difference detector 11.

For each value of magnetic field H, an identical curve centered about a frequency $F_o$ of different value can be obtained. The frequency variations of resonance of a ferromagnetic material are proportional to the variations of the bias field which polarizes the material.

The system may be in a closed loop. A field control circuit 17, controllable by an input 18 provides current to coil 16, schematically indicated only, energizing the magnet 2 to provide the field H. The control 17 can be manually adjusted from terminal 18 to provide the field H necessary to provide resonance in garnet 1 for a given center frequency $F_o$. Alternatively, the output voltage *e* can be applied to a loop circuit 19 which controls field 17. Loop circuit 19 may be so constructed as to be insensitive to frequency excursions of the type due to frequency modulation of the input signal, so that the field 16, under control of field control 17, will always be maintained at the center frequency $F_o$. If the center frequency $F_o$ changes, the loop circuit 19 will control the field to follow the change; terminal 20, connected to the field control, can be used to provide an output signal indicative of the change in current supplied to coil 16, and thus of the magnetic field H, to follow the center frequency, so that the system can operate as a frequency detector.

The system of the present invention may be used to determine magnetic field strength. If the input frequency $F_O$ is maintained constant, as indicated by the arrow applied to the input, variations in the field of H will be detected, the output at terminal 15 being identical in form to the graph of FIG. 2, if the abscissa is considered to represent field strength H, and the ordinate the voltage *e* from the output of circuit 11. This curve will then be centered about a value $H_O$ of the bias field, upon application of a constant frequency $F_O$ to the input of hybrid circuit No. 1, unit 3 of FIG. 1, for which the garnet is in resonance. The output voltage *e* will thus be characteristic of the variations of the intensity of the field H. This field may be varied, for example, under control of terminal 18, or may be an outside field (not shown) which is being balanced by the loop circuit 19, when inserted, the error signal to obtain balance then being available at terminal 20.

The system of the present invention has various advantages which permit use in a number of applications. Utilizing a pair of identical circulators 4, 5, permits an input frequency over a wide band; likewise, the ferromagnetic material of garnet 1 is inherently a wideband material so that the entire system can operate over a wide band of input frequencies and is not constrained by limitations of any one single element therein. The discrimination transfer curve is very close to a straight line, so that little distortion is introduced. This excellent transfer quality is due to the fact that the center of the curve ($F_o$ or $H_o$) of FIG. 2 corresponds to the center of the resonance curve of the ferromagnetic material, so that deformation due to parasitic resonances, so often noticeable at flanks or sides of the resonance curves, are essentially avoided.

Ferromagnetic resonators have the substantial advantage over cavities that the center frequency can be varied electrically, that is by adjustment of an electromagnet in the magnetic bias field, permitting rapid and simple control.

The system of the present invention can readily be incorporated in a servo frequency control loop, or in a magnetic control loop, since control of the center frequency can be obtained entirely electrically; the system may be used, for example, for indicating variations of input frequencies, or of magnetic fields by obtaining output signals from terminal 20 representative of the field strength H applied to the garnet 1. The hybrids, and the electronic circuitry can be miniaturized, the circuits including the lines 6 and 7 being formed as microstrips, with the resonator a small garnet sphere.

Various changes and modifications may be made in the system in accordance with the desired use and the type of signals applied and taken off at the output.

I claim:

1. Signal-processing circuit to transform characteristics of electrical signals, varying about a center value, into other signals, having a similar variation comprising a first hybrid microwave circuit (3) connected to have a microwave signal ($A_F$) applied thereto, said first hybrid circuit splitting said microwave signal into two signal components ($a$; $-ja$) 90° out of phase with respect to each other;
   a second hybrid circuit (8) having the signal components from said first hybrid circuit applied thereto and being connected to deliver an output forming the sum and differences of the input signals to the second hybrid circuit;
   a pair of circuits (4, 5) interconnecting said signal components between said first and second hybrid circuit;
   and a ferromagnetic resonator means (1, 2) located in a magnetic field (H), the field strength of said field for the resonator being selectable with respect to the center frequency of said microwave signal, said ferromagnetic resonator being inserted in one of the interconnecting circuits of said pair.

2. Circuit according to claim 1 including a difference detector (11) connected to the output of the second hybrid circuit.

3. Circuit according to claim 1 wherein the interconnecting circuits comprise a pair of identical circulators (4, 5), the ferromagnetic resonator (1) being connected to one (5) of the circulators;
   and wave reflection means (7) connected to the other (4) of the circulators.

4. Circuit according to claim 3 wherein the wave reflection means comprises a terminating element (7) having a reflection factor of about unity without introducing a substantial phase or frequency shifts.

5. Circuit according to claim 1 wherein the ferromagnetic resonator is a sphere (1) of yttrium iron garnet.

6. Circuit according to claim 1 wherein the first hybrid circuit (3) is a 3db. coupler;
   and the second hybrid circuit is a magic Tee.

7. Circuit according to claim 1 for use as a frequency detector, wherein the electrical characteristic is an excursion of frequency of the microwave signal;
   and said magnetic field affecting the ferromagnetic resonator (1) is selected to polarize the resonator at the center frequency of the microwave signal.

8. Circuit according to claim 1 wherein said ferromagnetic resonator includes means (16, 17) generating an adjustable magnetic field (H);
   and means controlling the intensity of said magnetic field and setting said intensity to provide for resonance of said ferromagnetic resonator at the center frequency of the microwave signal.

9. Circuit according to claim 8 including a feedback loop (11, 19) interconnecting the output from said second hybrid circuit (8)
   and means generating an adjustable magnetic field and connected to control the field strength about the center frequency of the microwave signal.

10. Circuit according to claim 8 wherein the variation about the center value of field strength ($H_O$) of the magnetic field (H) polarizing the ferromagnetic resonator is to be analyzed;
   said first hybrid circuit (3) has a signal of predetermined microwave frequency ($F_o$) applied thereto and said means generating said magnetic field (17, 16) is preset (18) to provide a field ($H_o$) polarizing said resonator to said predetermined frequency;
   the output from said second hybrid circuit (8) being indicative of variation of magnetic field polarizing said ferromagnetic resonator, about said center value.

* * * * *